United States Patent [19]

Lee et al.

[11] Patent Number: 5,313,425
[45] Date of Patent: May 17, 1994

[54] SEMICONDUCTOR MEMORY DEVICE HAVING AN IMPROVED ERROR CORRECTION CAPABILITY

[75] Inventors: Hyong-Gon Lee; Sung-Hee Cho; Se-Jin Kim, all of Suwon, Rep. of Korea

[73] Assignee: Samsung Electronics Co., Ltd., Kyungki-do, Rep. of Korea

[21] Appl. No.: 51,408

[22] Filed: Apr. 23, 1993

[30] Foreign Application Priority Data

Nov. 23, 1992 [KR] Rep. of Korea ............... 1992-22114

[51] Int. Cl.⁵ .................................................. G11C 13/00
[52] U.S. Cl. .................................... 365/201; 371/21.1
[58] Field of Search ............. 365/200, 201; 371/21.1, 371/21.2, 67.1

[56] References Cited

U.S. PATENT DOCUMENTS 4,692,923 9/1987 Poepelman ........................ 371/38

Primary Examiner—Terrell W. Fears
Attorney, Agent, or Firm—Charles R. Donohoe; Robert A. Westerlund; Stephen R. Whitt

[57] ABSTRACT

A semiconductor memory device which is comprised of a plurality m of electrically isolated data memory sub-arrays for storing data bits and a plurality k of electrically isolated parity memory sub-arrays for storing parity bits, wherein each of the data and parity memory sub-arrays includes a plurality of memory cells arranged in a matrix of rows and columns, with the memory cells in each row connected to a common word line and the memory cells in each column connected to a common bit line. Row address decoders function to activate a selected word line in each of the memory sub-arrays, and column address decoders, in combination with column selection circuitry, function to couple a selected bit line in each of the memory sub-arrays to a plurality m of sense amplifiers, which function to sense the voltage level of respective ones of the selected bit lines, and produce output data and parity bits representative of these sensed voltage levels. An error checking and correction circuit compares the output data and parity bits in order to detect and correct errors in the output data bits. Because of the unique architecture of the semiconductor memory device of this invention, defects in word lines or bit lines are confined to a single bit, thereby rendering these defects easily reparable by means of an ECC circuit alone, and thus dispensing with the need for a redundant memory circuit.

20 Claims, 7 Drawing Sheets

SEMICONDUCTOR MEMORY DEVICE HAVING AN IMPROVED ERROR CORRECTION CAPABILITY

BACKGROUND OF THE INVENTION

The present invention relates generally to semiconductor memory devices, and more particularly, to a semiconductor memory device having an improved architecture which isolates bit line and word line defects to a single bit, to thereby facilitate improved error correction capability relative to semiconductor memory devices having a conventional architecture.

In the field of semiconductor memory devices, it is conventional to repair defects of the memory cells thereof by means of either a redundant memory circuit or an ECC circuit, to thereby improve the yield of the process for manufacturing the semiconductor memory devices. However, these conventional techniques for repairing defective memory cells suffer from the following drawbacks and shortcomings.

Namely, in semiconductor memory devices which utilize a redundant memory circuit, after the wafer fabrication process, an additional procedure is required to identify the defective memory cells and to program the redundant memory circuit with the addresses of the identified defective memory cells. This is a time-consuming procedure which reduces throughput and increases manufacturing costs. Further, it is difficult to utilize the redundancy technique in read only memories (ROMs) and the like.

In semiconductor memory devices which utilize an ECC circuit, the device architecture limits the effectiveness of the ECC circuit, in a manner which will become clear hereinafter. In general, the ECC circuit requires k parity bits for each m-bit input data word, in accordance with the well-known Hamming code, which is mathematically represented by the following equation (1):

(1) $2^k \geq m+k+1$, where m is the number of data bits per data word, and k is the corresponding number of parity bits. For example, if the number (m) of data bits is 8, the number (k) of parity bits is 4, and if the number (m) of data bits is 16, the number (k) of parity bits is 5.

During a write mode of operation, the ECC circuit generates k parity bits corresponding to the m data bits of an input data word, and both the m data bits and the corresponding k parity bits are stored in the memory cell array of the memory device. During a read mode of operation, the m data bits and the corresponding k parity bits of an output data word are read-out of the memory cell array, and the ECC circuit compares the k parity bits and the m data bits to detect and correct errors which may be present in the output data word.

With reference now to FIGS. 1, 2, and 3, there can be seen a semiconductor memory device incorporating an ECC circuit having a conventional architecture, and disclosed in U.S. Pat. No. 4,692,923, issued to Alan D. Poeppelman on Sep. 6, 1987. The semiconductor memory device illustrated in FIG. 1 includes a plurality of memory sub-arrays D0-DN, the interconnection of which is depicted in greater detail in FIG. 2. FIG. 3 is a more detailed circuit diagram of the portions of the memory device depicted in FIG. 2. As can be readily seen in FIGS. 1 and 2, each of the memory sub-arrays D0-DN includes a plurality of stack sets Ni (i=1-N), each comprised of two strings of memory cells.

With particular reference now to FIGS. 1 and 3, there can be seen a plurality of bank select lines each of which are connected to a different stack set in each of the memory sub-arrays D0-DN. It will be appreciated that, in operation, the activation of a particular bank select line will result in the selection of a different stack set in each of the memory sub-arrays D0-DN, i.e., a bank of different stack sets, one from each sub-array. For example, the activation of the bank select line N selects stack set 0 in the sub-array D0, the stack set 1 in the sub-array D1, and the stack set N in the sub-array DN. With this configuration, defects in a particular word line can be confined to only one bit of the output data word, since each bit of the output data word is taken from a stack set which contains different word lines than do the stack sets from which the remaining bits of the output data word are taken.

However, the above-described ECC scheme suffers from the following drawbacks and shortcomings. Namely, defects in the bank select lines themselves can not be repaired at all, thereby limiting the utility of this ECC scheme. Further, since each bank select line is connected to selection transistors in all of the sub-arrays, the loading of the bank select lines is undesirably large, thereby increasing power dissipation and causing operational delays. Moreover, since the bank select lines must cross the memory sub-arrays, the layout and maskwork of the memory chip are rendered more difficult, thereby unduly increasing the cost and complexity of fabricating the memory chips, and unduly decreasing the reliability thereof. Furthermore, operating speed is undesirably decreased and power consumption undesirably increased by virtue of the architecture of the conventional semiconductor memory device, as will now be described with particular reference to FIG. 3. More particularly, a bus row signal O of an even row bus line is connected to word lines WL31, WL32 through respective depletion-type MOS transistors whose gates are connected to a supply voltage Vcc, and a bus row signal 1 of an odd row bus line is connected to word lines WL41, WL42 through respective depletion-type MOS transistors whose gates connected are to the supply voltage Vcc. With this arrangement, all of the word lines are simultaneously changed to either the supply voltage Vcc or the ground voltage Vss when the voltage level of the bus row signal 0 or the bus row signal 1 is changed, thereby resulting in an unduly high level of power consumption and decreased operating speed. In a high integration density memory device, e.g., a 64M or 256M DRAM, this problem is magnified, since the number of word lines connected to the bus row signals is significantly greater than is the case with presently available DRAMs.

Based upon the above and foregoing, ot can be appreciated that there presently exists a need in the semiconductor memory art for a semiconductor memory device which eliminates the above-described drawbacks and shortcomings of the presently available semiconductor memory devices. The present invention fulfills this need.

SUMMARY OF THE INVENTION

The present invention encompasses a semiconductor memory device which is comprised of a plurality m of electrically isolated data memory sub-arrays for storing data bits and a plurality k of electrically isolated parity memory sub-arrays for storing parity bits, wherein each of the data and parity memory sub-arrays includes a plurality of memory cells arranged in a matrix of rows and columns, with the memory cells in each row connected to a common word line and the memory cells in each column connected to a common bit line. Row address decoders function to activate a selected word line in each of the memory sub-arrays, and column address decoders, in combination with column selection circuitry, function to couple a selected bit line in each of the memory sub-arrays to a plurality m of sense amplifiers, which function to sense the voltage level of respective ones of the selected bit lines, and produce output data and parity bits representative of these sensed voltage levels. An error checking and correction circuit compares the output data and parity bits in order to detect and correct errors in the output data bits.

The plurality of row decoders are preferably disposed between respective adjacent pairs of the data and parity memory sub-arrays. Each of the row decoders preferably includes a first drive circuit for activating a selected word line in a first memory sub-array of the respective adjacent pair and a second driver circuit for activating a selected word line in a second memory sub-array of the respective adjacent pair, with the first and second driver circuits being electrically isolated from each other.

Because of the unique architecture of the semiconductor memory device of this invention, defects in word lines or bit lines are confined to a single bit, thereby rendering these defects easily reparable by means of an ECC circuit alone, and thus dispensing with the need for a redundant memory circuit.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
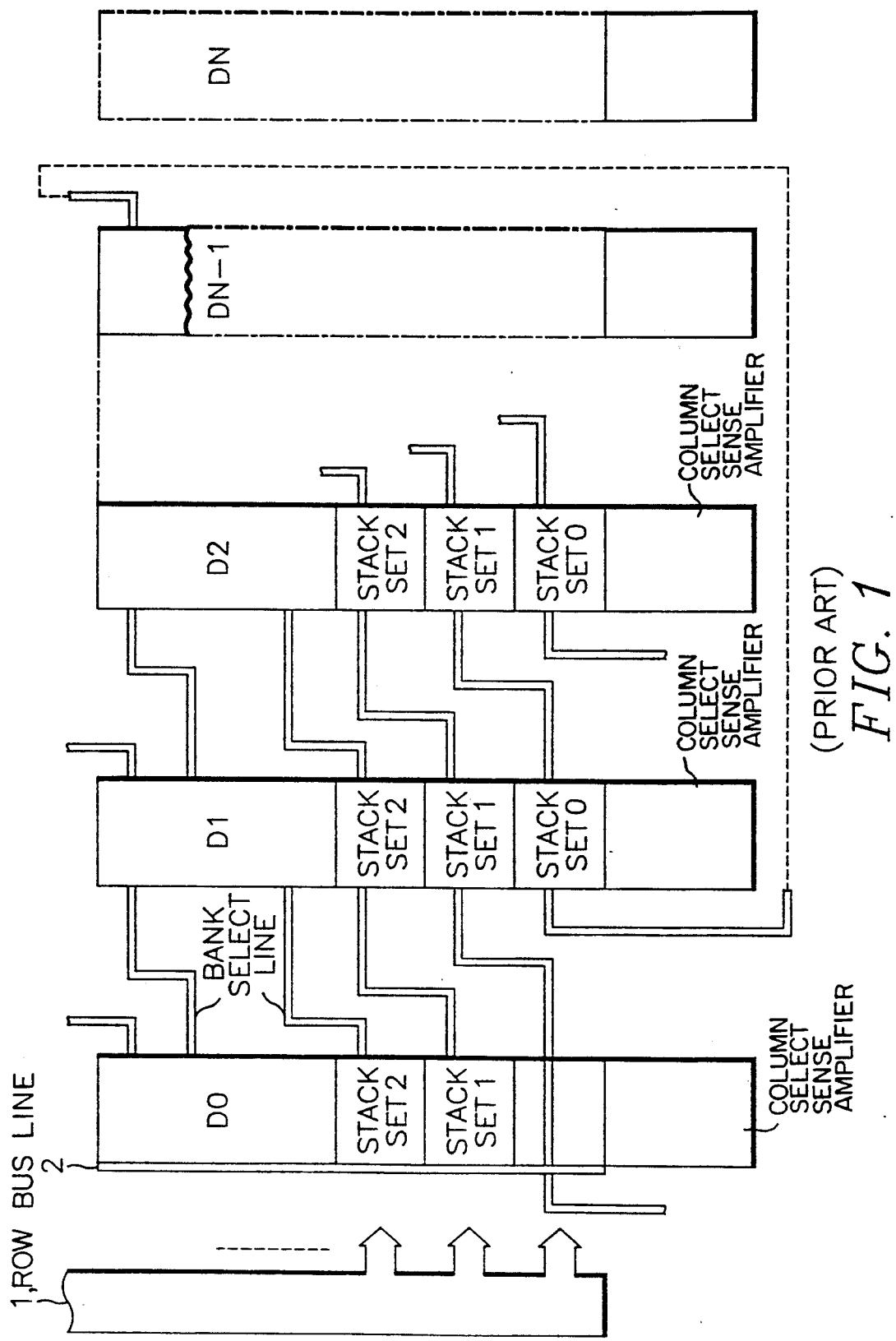
FIG. 1 is a block diagram of a conventional semiconductor memory device disclosed in U.S. Pat. No. 4,692,923.
Figure 2:
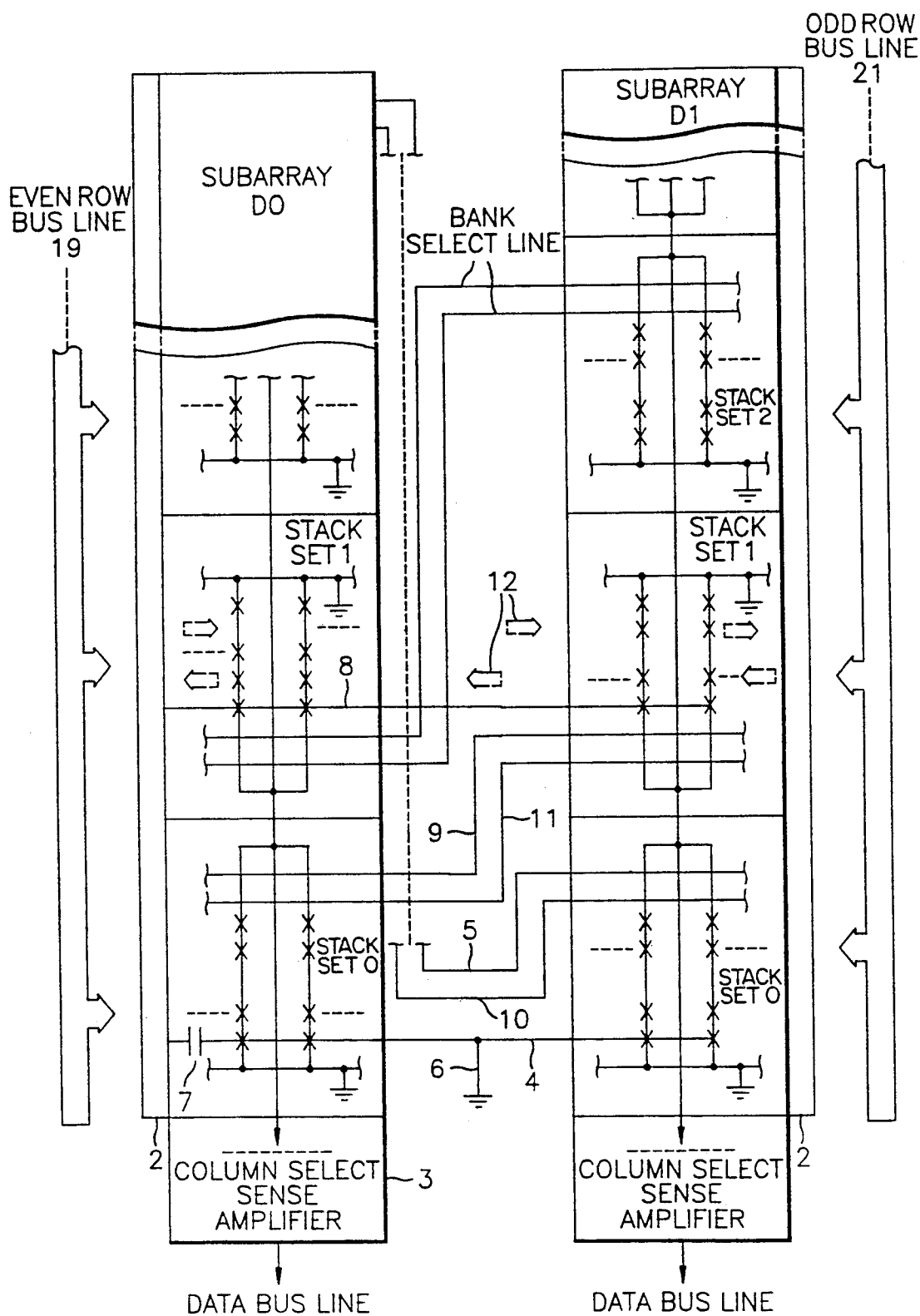
FIG. 2 is a more detailed block diagram of two of the subarrays (D0 and D1) of the semiconductor memory device depicted in FIG. 1.
Figure 3:
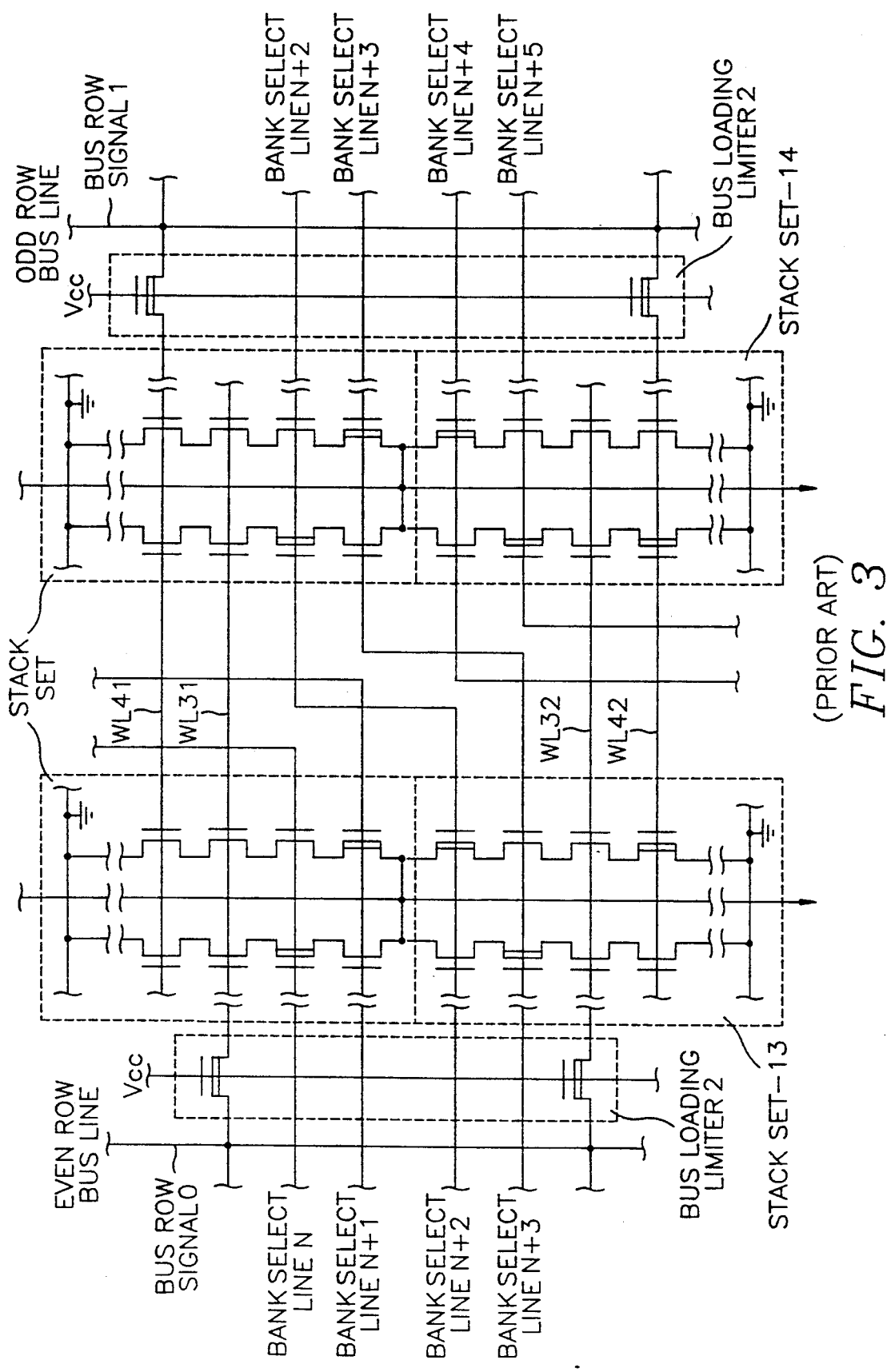
FIG. 3 is a circuit diagram of the two subarrays depicted in FIG. 2.
Figure 4:
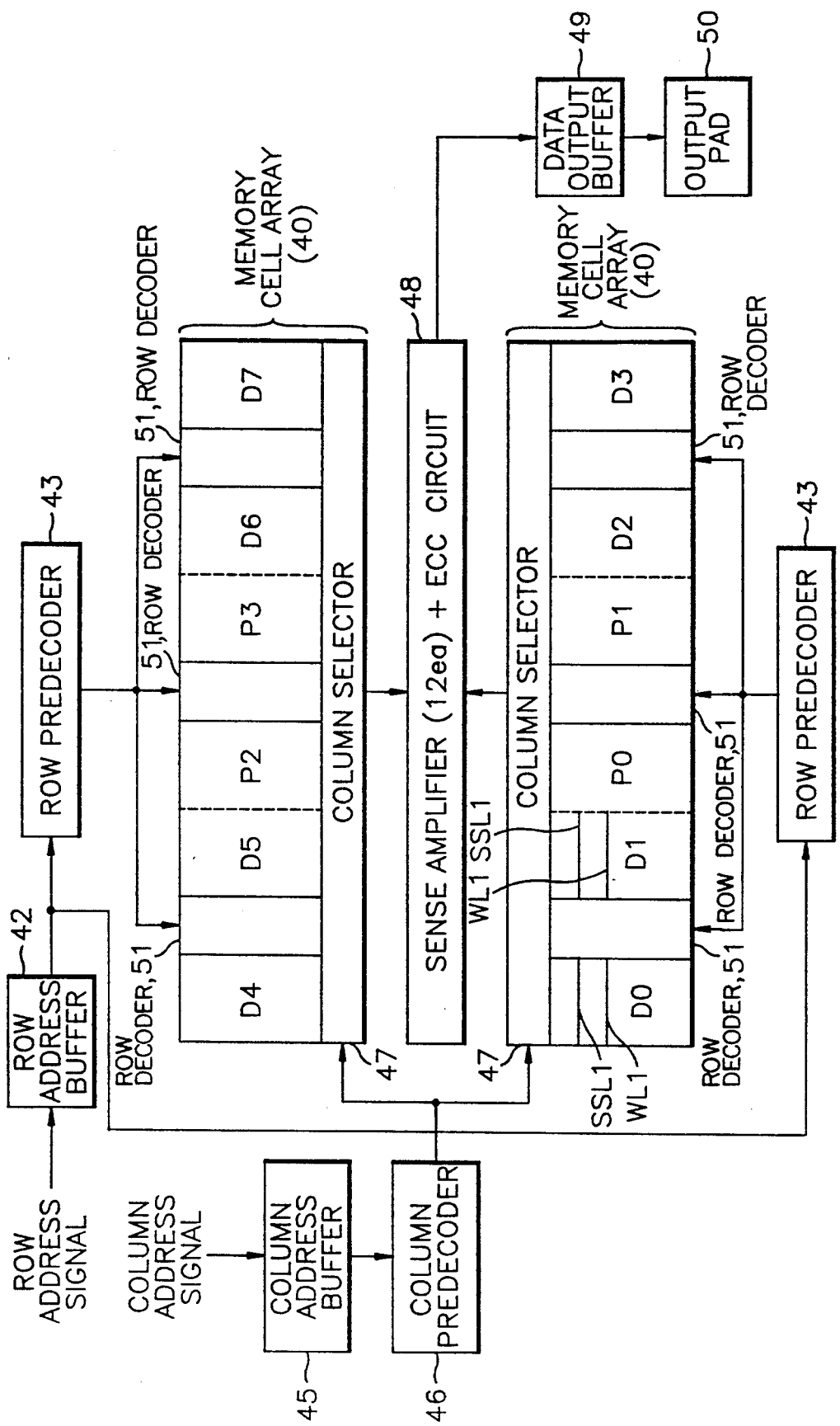
FIG. 4 is a block diagram of a semiconductor memory device constructed in accordance with a first preferred embodiment of the present invention.

With reference now to FIG. 4, a semiconductor memory device constructed in accordance with a first preferred embodiment of the present invention will now be described. The semiconductor memory device of this embodiment includes a memory cell array comprised of twelve memory blocks or sub-arrays D0-D7, and P0-P3. The memory sub-arrays D0-D7 and P0-P3 each include a plurality of memory cells arranged in a matrix of rows and columns, with the memory cells in each row (i) connected to a common word line (W/Li), and the memory cells in each column (j) connected to a common bit line (B/Lj). The memory sub-arrays D0-D7 are adapted to store data bits, and the memory sub-arrays P0-P3 are adapted to store parity bits, which are utilized by an ECC circuit to correct detected defects in the corresponding data bits. As will be readily evident to those skilled in the semiconductor memory art, in this embodiment, there are four parity bits for each eight-bit data word. The data bit sub-arrays D0-D7 and the parity bit sub-arrays P0-P3 can suitably be randomly arranged, although this is not limiting to the present invention, as any other convenient arrangement may be employed.

With continuing reference to FIG. 4, row and column address buffers 42,45 amplify externally supplied row address signals and column address signals for application to the row predecoders 43, and the column predecoder 46, respectively. With additional reference now to FIG. 5, the row predecoders 43 and row decoders 51 function to decode the row address signals, and to select one word line (W/Li) out of a plurality of word lines (WLO-WLn), and one string selection line (SSLi) out of a plurality of string selection lines (SSLO-SSLn), in each of the memory sub-arrays D0-D7 and P0-P3). Although not limiting to the present invention, the row decoders are preferably implemented like the one depicted in FIG. 6, which is disclosed in Korea Patent No. 1989-16428, filed Nov. 13, 1989, entitled "Word Line Decoder of a Semiconductor Memory Device", and assigned to the assignee of the present invention. An improved word line decoder which also has particular utility in the practice of the present invention is the one disclosed in Korea Patent No. 1992-20209, filed Oct. 30, 1992, and also assigned to the assignee of the present invention.

The column predecoder 46 and the column selectors 47 function to decode the column address signals, and to select one bit line (B/L) out of a plurality of bit lines in each of the memory sub-arrays D0-D7 and P0-P3. Twelve sense amplifiers (shown in box 48) selectively coupled to respective ones of the the twelve selected bit lines function to sense the eight data bits and four parity bits read from the selected one of the memory cells in each respective one of the twelve memory sub-arrays, by sensing the voltage on the respective selected bit lines. The ECC circuit (shown in box 48) uses the four sensed parity bits to detect errors, preferably of not more than one bit, in the eight data bits, and corrects any error so detected. The ECC circuit applies the eight data bits, corrected as required, to a data output buffer 49, which serves to amplify the eight corrected data bits for application to external circuitry.

Figure 5:
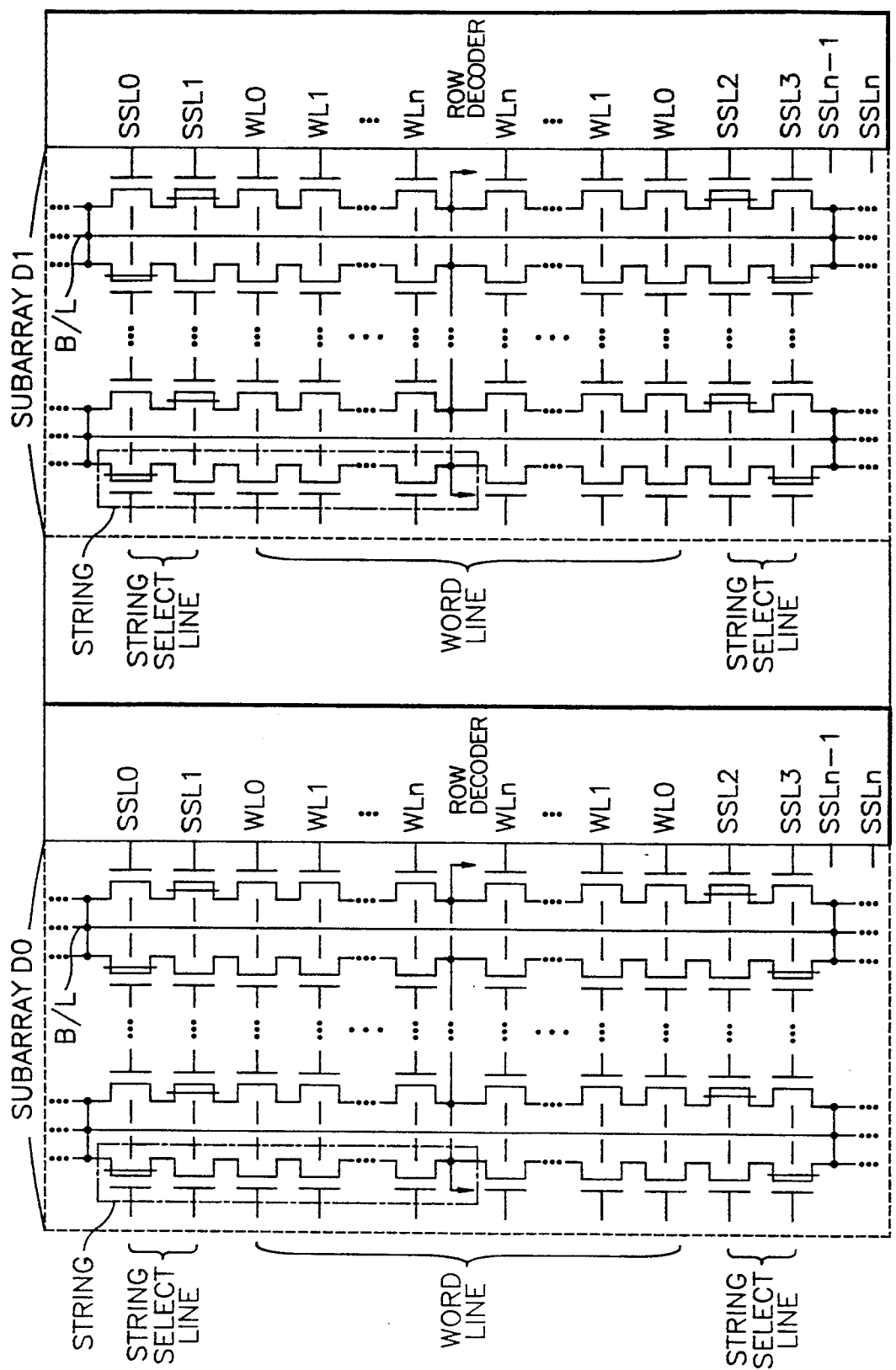
FIG. 5 is a circuit diagram of two of the subarrays (D0 and D1) of the semiconductor memory device depicted in FIG. 4.
Figure 6:
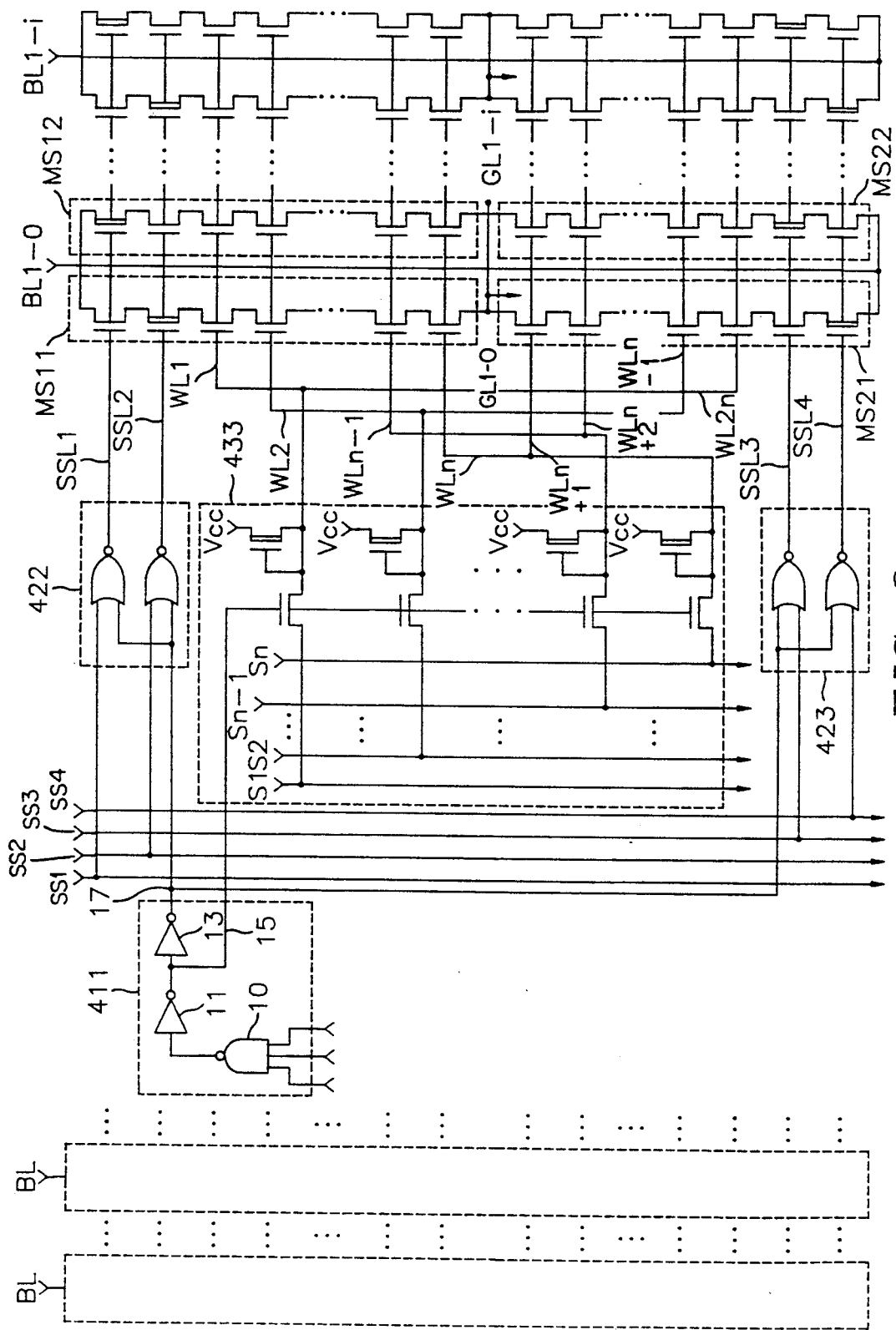
FIG. 6 is a circuit diagram of an exemplary embodiment of a row decoder which has a particular utility in the semiconductor memory device depicted in FIG. 4; and, FIG. 7 is a block diagram of a semiconductor memory device constructed in accordance with a second preferred embodiment of the present invention.

With continuing reference to FIG. 5, the internal operation of the memory device will now be described in greater detail. More particularly, during a read operation as described above, one string selection line SSLi is selected in each memory sub-array by a driver of the row decoder coupled thereto, and further, one word line WLi is selected in each selected string in each memory sub-array by a driver of the row decoder coupled thereto. In this manner, only one memory cell is selected in each memory sub-array, corresponding to one data or parity bit of the twelve-bit output data word.

In accordance with the present invention, the drivers of one row decoder are electrically isolated from the drivers of the other row decoders, and further, each pair of memory sub-arrays (e.g., D0 and D1) coupled to a common row decoder, are connected to different, electrically isolated drivers of the common row decoder. Further, the string selection lines and word lines are electrically isolated from each other.

With this novel architecture, even if one of the string selection lines or one of the word lines are shorted, or otherwise defective, the defect would be isolated to only one memory cell, and therefore, only one of the twelve data and parity bits comprising each word read from the entire memory cell array would be defective, which can be easily corrected by the ECC circuit. Further, since only one memory cell in one memory sub-array is selected by one string line and one word line signal, the loading of these lines is relatively small, thus facilitating a higher speed of operation and lower power dissipation than is possible with semiconductor memory devices having a conventional architecture. Moreover, this loading is not increased with increases in the density of the semiconductor memory device.

Figure 7:
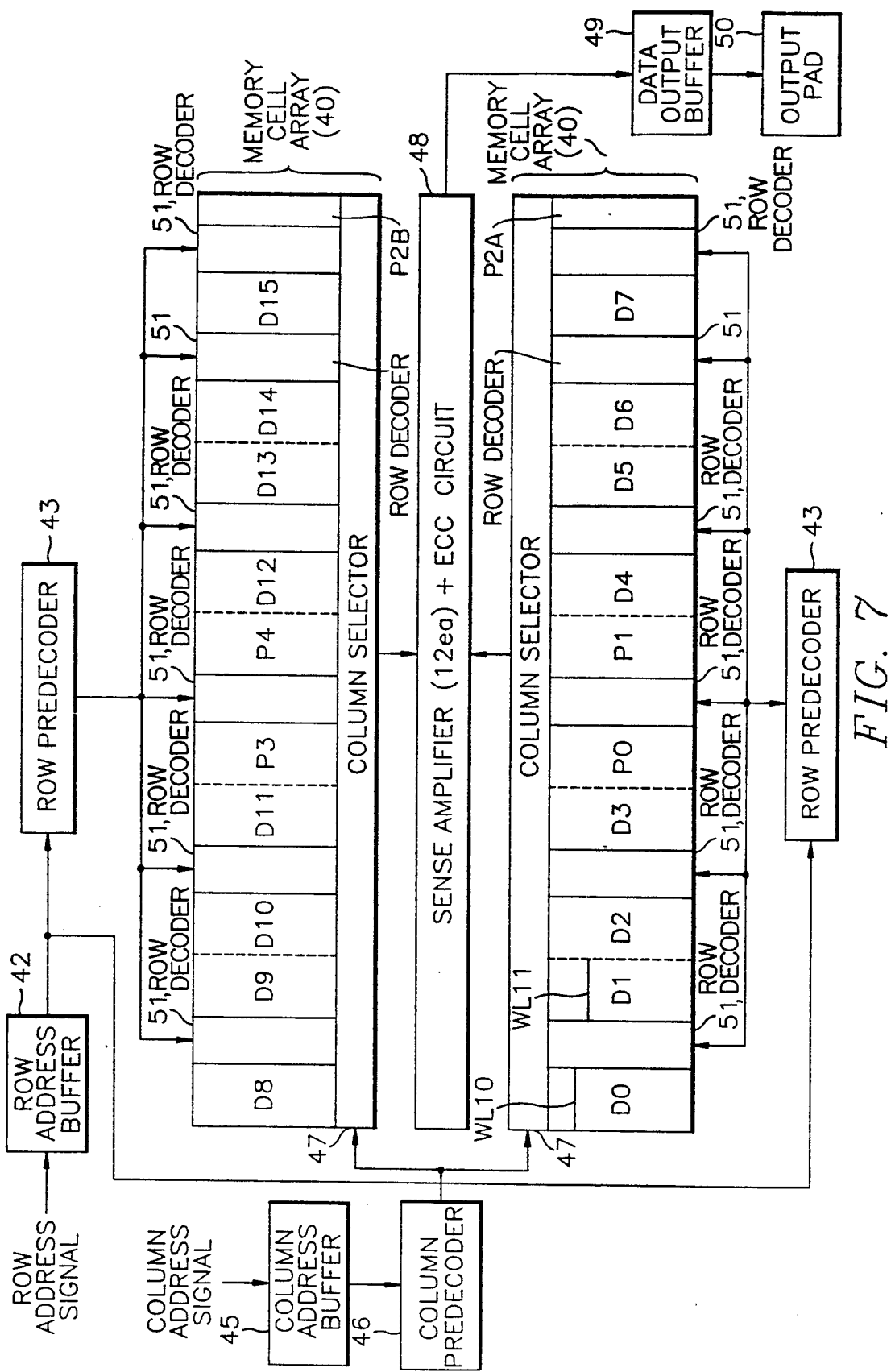

With reference now to FIG. 7, there can be seen a semiconductor memory device constructed in accordance with a second preferred embodiment of the present invention, and having the same architecture as that of the memory device of the first preferred embodiment, except that the memory cell array is comprised of sixteen memory sub-arrays D0–D15 for storing data bits, and five memory sub-arrays P0–P4 for storing parity bits. In general, the number of normal/data and parity bits utilized is not limiting to the present invention.

As can be appreciated from the foregoing description, defects in bit lines or word lines of a semiconductor memory device constructed in accordance with the principles of the present invention are confined to a single bit by means of independently activating n electrically isolated string selection lines and word lines by means of n/2 row decoders, thereby enabling any such defects to be repaired by an ECC circuit alone. Since all defects are reparable by the ECC circuit alone, the need for a redundant memory circuit is eliminated, thereby eliminating the drawbacks and shortcomings of semiconductor memory chips which utilize redundant memory, e.g., increased chip size, decreased throughput, increased manufacturing costs, decreased yield, and decreased reliability. Moreover, the semiconductor memory device embodying the present invention exhibits enhanced performance relative to the presently available semiconductor memory devices which utilize an ECC circuit for repairing defects, e.g., lower power consumption and increased operating speed.

Although two preferred embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A semiconductor memory device, comprising:
 a plurality m of electrically isolated data memory sub-arrays for storing data bits;
 a plurality k of electrically isolated parity memory sub-arrays for storing parity bits;
 wherein each of said data and parity memory sub-arrays includes a plurality of memory cells arranged in a matrix of rows and columns, with the memory cells in each row connected to a common word line and the memory cells in each column connected to a common bit line;
 row decoding means for selecting a word line in each of said data and parity memory sub-arrays;
 column decoding means for selecting a bit line in each of said data and parity memory sub-arrays;
 a plurality of sense amplifiers for sensing the voltage level of respective ones of said selected bit lines, and for producing output data and parity bits representative of the sensed voltage levels of said selected bit lines; and,
 an error checking and correction circuit for detecting and correcting errors in said output data bits.

2. The semiconductor memory device as set forth in claim 1, wherein said error checking and correction circuit includes circuitry for comparing said output data bits and said output parity bits.

3. The semiconductor memory device as set forth in claim 1, wherein said data and parity memory sub-arrays are electrically isolated from each other.

4. The semiconductor memory device as set forth in claim 3, wherein said row decoding means includes a plurality, (m+k)/2, of row decoders disposed between respective adjacent pairs of said data and parity memory sub-arrays.

5. The semiconductor memory device as set forth in claim 4, wherein each of said row decoders includes a first driver circuit for activating a selected word line in a first memory sub-array of the respective adjacent pair and a second driver circuit for activating a selected word line in a second memory sub-array of the respective adjacent pair, said first and second driver circuits being electrically isolated from each other.

6. The semiconductor memory device as set forth in claim 5, wherein each column of each of said data and parity memory sub-arrays includes at least two strings of memory cells and means for selectively coupling a selected one of said strings to said common bit line associated with said column.

7. The semiconductor memory device as set forth in claim 6, wherein each of said selectively coupling means includes at least two string selection lines selectively activated by a respective one of said row decoders.

8. The semiconductor memory device as set forth in claim 7, wherein said word lines and said string selection lines for each of said data and parity memory sub-arrays are electrically isolated from one another.

9. The semiconductor memory device as set forth in claim 8, wherein the number m of data memory sub-arrays and the number k of parity memory sub-arrays are selected in accordance with the Hamming code.

10. The semiconductor memory device as set forth in claim 9, wherein the semiconductor memory device is a read-only type of memory device.

11. The semiconductor memory device as set forth in claim 9, wherein the semiconductor memory device is a random-access type of memory device.

12. The semiconductor memory device as set forth in claim 11, wherein the semiconductor memory device is a DRAM fabricated on a single semiconductor chip.

13. A semiconductor memory device, comprising:
 a plurality m of electrically isolated data memory sub-arrays for storing data bits;

a plurality k of electrically isolated parity memory sub-arrays for storing parity bits;

wherein each of said data and parity memory sub-arrays includes a plurality of memory cells arranged in a matrix of rows and columns, with the memory cells in each row connected to a common word line and the memory cells in each column connected to a common bit line;

a plurality x of row decoders for selecting a word line in each of said data and parity memory sub-arrays;

a column selector for selecting a bit line in each of said data and parity memory sub-arrays;

a plurality of sense amplifiers for sensing the voltage level of respective ones of said selected bit lines, and for producing output data and parity bits representative of the sensed voltage levels of said selected bit lines; and, an error checking and correction circuit responsive to said output data and parity bits for detecting and correcting errors in said output data bits.

14. The semiconductor memory device as set forth in claim 13, wherein $x=(m+k)/2$.

15. The semiconductor memory device as set forth in claim 14, wherein said plurality of row decoders are disposed between respective adjacent pairs of said data and parity memory sub-arrays.

16. The semiconductor memory device as set forth in claim 13, wherein said data and parity memory sub-arrays are electrically isolated from each other.

17. The semiconductor memory device as set forth in claim 15, wherein each of said row decoders includes a first driver circuit for activating a selected word line in a first memory sub-array of the respective adjacent pair and a second driver circuit for activating a selected word line in a second memory sub-array of the respective adjacent pair, said first and second driver circuits being electrically isolated from each other.

18. The semiconductor memory device as set forth in claim 17, wherein each column of each of said data and parity memory sub-arrays includes at least two strings of memory cells and means for selectively coupling a selected one of said strings to said common bit line associated with said column.

19. The semiconductor memory device as set forth in claim 18, wherein each of said selectively coupling means includes at least two string selection lines selectively activated by a respective one of said row decoders.

20. The semiconductor memory device as set forth in claim 19, wherein said word lines and said string selection lines for each of said data and parity memory sub-arrays are electrically isolated from one another.

* * * * *